US008168896B2

(12) United States Patent
Loibl et al.

(10) Patent No.: US 8,168,896 B2
(45) Date of Patent: May 1, 2012

(54) ELECTRONIC HOUSING

(75) Inventors: Josef Loibl, Bad Abbach (DE); Karl Smirra, Wasserburg (DE)

(73) Assignee: Continental Automotive GmbH, Hannover (DE)

( * ) Notice: Subject to any disclaimer, the term of this patent is extended or adjusted under 35 U.S.C. 154(b) by 376 days.

(21) Appl. No.: 12/597,303

(22) PCT Filed: Feb. 21, 2008

(86) PCT No.: PCT/EP2008/052127
§ 371 (c)(1),
(2), (4) Date: Oct. 23, 2009

(87) PCT Pub. No.: WO2008/128809
PCT Pub. Date: Oct. 30, 2008

(65) Prior Publication Data
US 2010/0133001 A1 Jun. 3, 2010

(30) Foreign Application Priority Data

Apr. 23, 2007 (DE) .................. 10 2007 019 096

(51) Int. Cl.
*H01L 23/28* (2006.01)
(52) U.S. Cl. ........................ 174/522; 361/737
(58) Field of Classification Search .................. 174/521, 174/522; 361/737
See application file for complete search history.

(56) References Cited

U.S. PATENT DOCUMENTS

| 3,838,316 | A | * | 9/1974 | Brown et al. | 361/679.01 |
|---|---|---|---|---|---|
| 4,195,201 | A | * | 3/1980 | Gryl et al. | 178/46 |
| 4,777,520 | A | * | 10/1988 | Nambu et al. | 257/793 |
| 4,855,807 | A | * | 8/1989 | Yamaji et al. | 257/670 |
| 4,897,508 | A | * | 1/1990 | Mahulikar et al. | 174/522 |
| 5,121,289 | A | * | 6/1992 | Gagliardi | 361/679.01 |
| 5,455,386 | A | * | 10/1995 | Brathwaite et al. | 174/529 |
| 5,686,698 | A | * | 11/1997 | Mahadevan et al. | 174/522 |
| 5,734,125 | A | * | 3/1998 | Yasukuni et al. | 174/522 |
| 6,245,995 | B1 | * | 6/2001 | Coorod et al. | 174/522 |
| 7,897,234 | B2 | * | 3/2011 | Selverian et al. | 428/76 |
| 2002/0056562 | A1 | * | 5/2002 | Skrzypchak | 174/52.2 |
| 2002/0134569 | A1 | * | 9/2002 | Farquhar et al. | 174/52.2 |
| 2006/0293399 | A1 | | 12/2006 | Chan | |

FOREIGN PATENT DOCUMENTS

| FR | 2710810 A1 | 4/1995 |
|---|---|---|
| FR | 2803097 A1 | 6/2001 |
| WO | 9220096 A1 | 11/1992 |

* cited by examiner

*Primary Examiner* — Hung Ngo
(74) *Attorney, Agent, or Firm* — Laurence A. Greenberg; Werner H. Stemer; Ralph E. Locher

(57) ABSTRACT

An electronic housing, which includes at least two housing parts, has at least one housing base, a housing cover, and at least one electronic connection in the form of a printed circuit board between electronic substrates disposed in the housing interior and components positioned outside the housing, with the electronic connection being fixed on the housing base. The housing cover has a filling port for a casting compound, and the filling port is closed by a label. A method for the production of such an electronic housing and the use thereof for transmission control of a motor vehicle, are also provided.

18 Claims, 2 Drawing Sheets

ELECTRONIC HOUSING

BACKGROUND OF THE INVENTION

1. Field of the Invention

The invention relates to an electronic housing including at least two housing parts which have at least one housing base, a housing cover and at least one electronic connection in the form of a printed circuit board between electronic substrates disposed in the housing interior and components positioned outside the housing, which is fixed on the housing base, in particular for transmission or engine control within the automotive field.

Electronic devices generally comprise a plurality of electronic components, which are connected to other components outside the control device. They are normally used in special housings in order to protect them from environmental influences or mechanical stresses. Furthermore, the housings fulfill an important shielding function. To enable a reliable connection with components positioned outside the housing, an electrical connection from the housing interior to the housing exterior is needed. In recent times, this has preferably been embodied as a flexible printed circuit board.

2. Prior Art

The housing cover can be made of any material which guarantees adequate protection of the electronics from the given environmental influences. Housing covers are usually made of plastic, in order to cap the electronic components. Alternatively, a metallic plastic mold or a metallic housing cover can also be used.

With housing covers made of plastic, it is known to fill a casting compound to further protect the electronic components through an opening in the plastic cover. The filling ports are then closed by pushing in a plug, for instance in the form of balls or pins. This is disadvantageous in that significant pressing forces have to be applied, which bring about considerable deformation of the cover and may damage the casting compound. With a plastic cover, methods are also known of closing the filling port by welding a seal. The seal may be embodied in the manner of a plate or disk for instance. This is an additionally complex manufacturing step, which can only be automated with difficulty.

A reliable seal of a metallic cover, in particular of stamped flexural parts, which usually have thin wall thickness, can only be realized with difficulty. Such stamped flexural parts are not able to withstand the necessary pressure or pressing forces when closing the filling ports with plugs and are unusable as a result of deformation. A welding of the seal with such a metallic cover with thin wall thicknesses is also associated with difficulties and is very complicated.

Such a seal of the filling port is however key to protecting the sensitive electronic components, particularly if electronic components are exposed to aggressive media, as for instance prevail in gearboxes and engines for instance.

BRIEF SUMMARY OF THE INVENTION

Problem

The object of the invention is thus to provide an electronic housing which has a housing cover with a filling port for a casting compound, which can be easily reliably closed without the risk of deformation.

This is achieved in accordance with the invention with an electronic housing comprising at least two housing parts which have at least one housing base, a housing cover and at least one electronic connection in the form of a printed circuit board between electronic substrates disposed in the housing interior and components positioned outside the housing, which is fixed on the housing base, the housing cover has a filling port for a casting compound and the filling port is closed by a label as well as with a method for manufacturing such an electronic housing according to the invention, comprising at least one printed circuit board attached to the housing base as an electronic connection, being connected to the electronic substrate disposed inside the housing and the components positioned outside the housing, the housing cover being fastened to a sealing zone, a casting compound being filled through the filling port in the housing cover and the filling port then being closed with the label.

It is proposed in accordance with the invention to provide an electronic housing comprising a housing cover with a filling port for a casting compound, in which the filling port can be closed by a label.

In accordance with the invention, the term filling port is understood to mean a process opening in the housing cover, through which a casting compound can be filled for instance. Such a casting compound can significantly improve the protection of the sensitive electronics components from mechanical and chemical stresses, such as for instance vibration, humidity, dirt and corrosion. Furthermore, voltage isolation from the electronics can also be achieved by means of the compound. The filling port can also fulfill further test or production purposes. For instance, the housing can be evacuated through the filling port in order as a result to ensure the bubble-free nature of the casting compound and subsequently or simultaneously to monitor the electronic housing for leaktightness.

The inventive seal of the filling port using a label allows the necessary leak-tightness of the electronics housing to be easily produced without risking a deformation of the housing cover. The attachment of the label to the housing cover can advantageously take place by current serial labeling methods. The process can be automated, cost-effective and thus also suited to mass production. A complicated welding method for closing the filling port is no longer necessary. An additional advantage of the invention is that the label can be attached to the housing cover without any great pressure, so that stamped flexural parts made of metal can also be used as cover material. The inventive labels can also be used in aggressive environmental conditions, like for instance in motor vehicle gearboxes, and ensuring a reliable sealing of the housing cover and thus the protection of the electronic component in the interior of the housing.

Further advantageous configurations and developments, which can be used individually or in combination with one another, form the subject matter of the dependent claims.

The housing cover is preferably made of a metallic material and is manufactured for instance as a stamped flexural part made of steel sheet or copper. The housing cover is particularly preferably made of aluminum. This produces increased rigidity and service life stability, a good diffusion density relative to aggressive chemicals and improved EMC shielding values over the entire service life of the control device.

In a preferred embodiment of the invention, the label can be formed as an adhesive bond made of a carrier layer and an adhesive layer. The carrier layer can be made of a carrier material based on polyester, polyimide, polyvinylfluoride, polycarbonate for instance. Alternatively, the carrier material can also be a metallic material, for instance a film made of hard or soft aluminum or a steel film. Such carrier materials can be exposed particularly effectively to aggressive media and environmental conditions, such as for instance prevail in motor vehicle gearboxes. Other carrier materials, for instance tissue, non-woven material or compound materials, which can withstand the mechanical and chemical demands and stresses in the respective application, are also conceivable. A layer based on epoxide, silicon, or preferably acrylate can be used as an adhesive layer for instance.

In a further embodiment of the invention, the label can have a thickness of 25 μm to 350 μm, preferably 35 μm to 250 μm, particularly preferably 50 μm to 150 μm. Furthermore, the label can also have any desired form, for instance essentially round or angular.

Another advantageous embodiment provides that the surface ratio of the adhesive surface of the label on the housing cover surface relative to the surface of the filling port amounts to 3:1 to 15:1, preferably 5:1 to 10:1. The inventive labels can be advantageously adjusted to the demands of the respective application such that their adhesive force on the cover is greater than the pressure, which acts on the label through the filling port as a result of pressure changes, caused for instance by temperature change during operation and storage. A reliable seal of the housing cover with long term stability but also over the overall service life of a motor vehicle gearbox is ensured in this way.

One further advantage is that the label can be marked or printed. A control seal label, manufacturer's instructions or type designation can be attached to the housing cover at the same time for instance.

An integrated electronic circuit in motor vehicles is exposed to an aggressive environment in the gearbox oil for instance. During operation and storage, it is exposed to very high and very low temperatures, within the range of −40° C. to +180° C., as well as considerable vibrations. In accordance with the invention, resin, polyurethane compounds or silicon can be used as casting compounds. These casting compounds can advantageously protect the electronic components from the said mechanical and/or chemical stresses.

Silicones or silicone gels are used particularly preferably in accordance with the invention. In addition to the additional advantages, silicone gels can also enable a particularly simple processing and prevent thermo mechanical stresses as a result of the low E-module.

To manufacture an inventive electronic housing, one or several printed circuit boards are attached to a housing base. The housing base is preferably made of a metallic material, particularly preferably aluminum. In a preferred embodiment of the invention, one or several flexible conductor boards are laminated onto the metallic housing base. This ensures a reliable, tight and cost-effective fixing. The contactings with an electronic substrate with electronic components inside the housing and with components positioned outside the housing are manufactured and the housing cover is then attached and fixed on the corresponding region of the base plate and/or the printed circuit board of the housing. This region can be sealed in a hermetically tight fashion and is also referred to as a sealing zone. The housing cover can therefore be attached in a hermetically tight fashion to the sealing zone, so that the electronic components positioned therebelow and regions of the printed circuit board are sufficiently protected. The contacting with the peripheral components can alternatively also take place after fixing the housing cover. In accordance with the invention, the housing cover contains a filling port through which the casting component can be filled into the housing interior. The casting compound allows an electronic substrate with the electronic components to be even better protected against mechanical and/or chemical stresses. After filling the casting compound, the housing cover can be tightly closed by means of an inventive label. Advantageously, this can be carried out automatically without the danger of the housing cover deforming.

In another embodiment of the method, the housing with the cast electronic components can be evacuated through the filling port advantageously prior to closing using the label. On the one hand, the blow freedom of the casting compound can be ensured, on the other hand, the leak-tightness of the housing can be checked simultaneously or subsequently. This therefore also enables a simple quality control. After such quality control, a marked label with a quality logo for instance is attached to the filling port.

BRIEF DESCRIPTION OF THE SEVERAL VIEWS OF THE DRAWING

The invention is described by way of example below with reference to an embodiment variant in conjunction with the drawings. It is however not restricted hereto.

DESCRIPTION OF THE INVENTION

Figure 1:
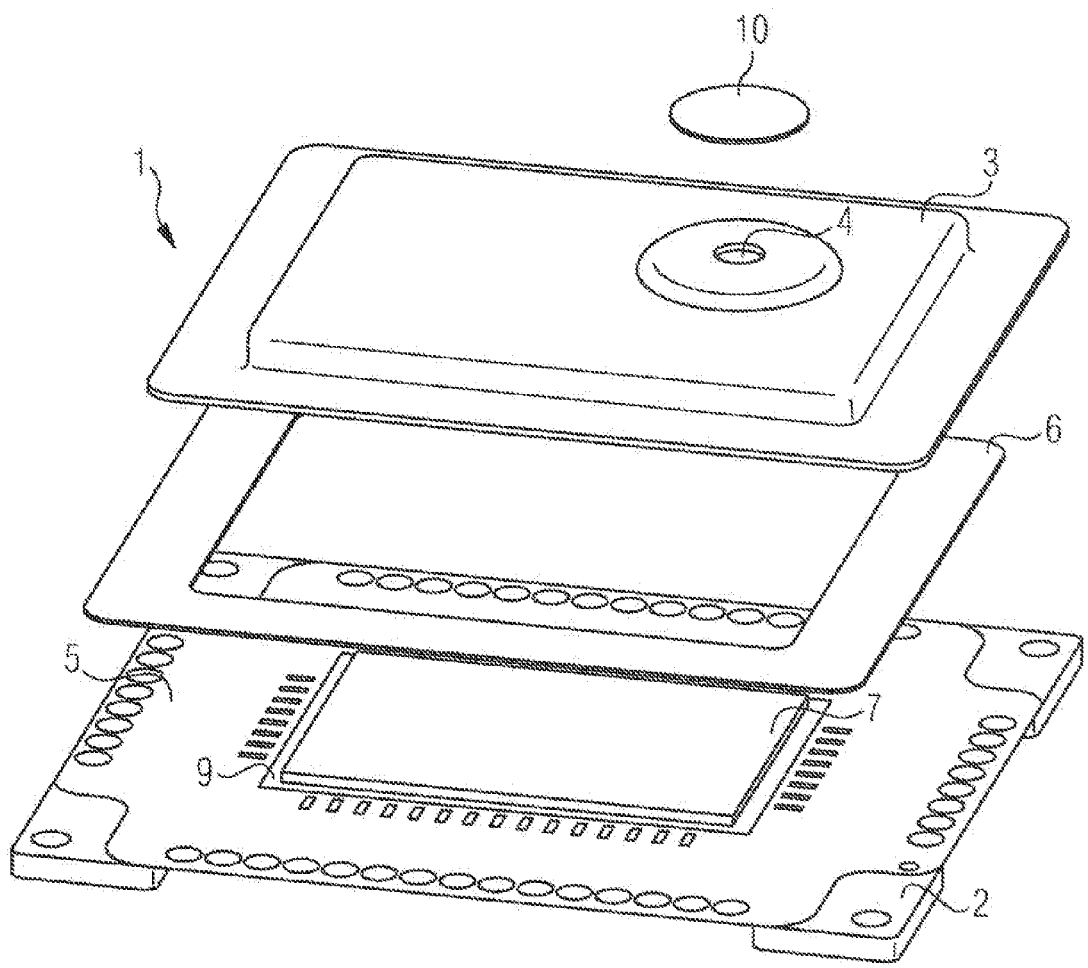
FIG. 1 shows a partially exploded representation of an inventive electronic housing and FIG. 2 shows a perspective top view onto the electronic housing in FIG. 1 in a closed state.

FIG. 1 shows an electronic housing 1 for an electronic device, which is provided for installation into a motor vehicle gearbox. The housing 1 is formed by a metallic base plate 2 and a metallic housing cover 3, which can preferably be formed as a stamped flexural part made of steel sheet or aluminum. A filling port 4 for a casting compound is introduced in the housing cover 3. The casting compound can preferably be a silicone gel. A printed circuit board 5 can be fixed to the metallic base plate 2 as an electronic connection. The printed circuit board 5 can be a flexible printed circuit board for instance. The housing has a sealing zone, which corresponds in terms of its shape to the support surface of the housing cover 3 and can also be sealed with a separate sealing system 6. An electronic substrate 7, which can comprise different electronic components for instance, is located within the housing 1. The substrate 7 with its different electronic components inside the housing 1 is connected by way of direct contacts (not shown), for instance by way of thick wire bonds with the printed circuit board 5. Furthermore, the printed circuit board 5 in the interior of the housing 1 is cut out and the electronic substrate 7 is arranged in the section 9 formed thereby. After casting the electronic components in the housing interior, the filling port 4 with the inventive label 10 can be sealed to be tight without the risk of deforming the housing cover 3. The seal with the label can take place automatically with current labeling methods. The housing 1 can also be evacuated through the filling port 4. The bubble-free nature of the casting compound can be ensured by means of evacuation. Furthermore, the leak-tightness of the housing 1 can also be checked.

Figure 2:
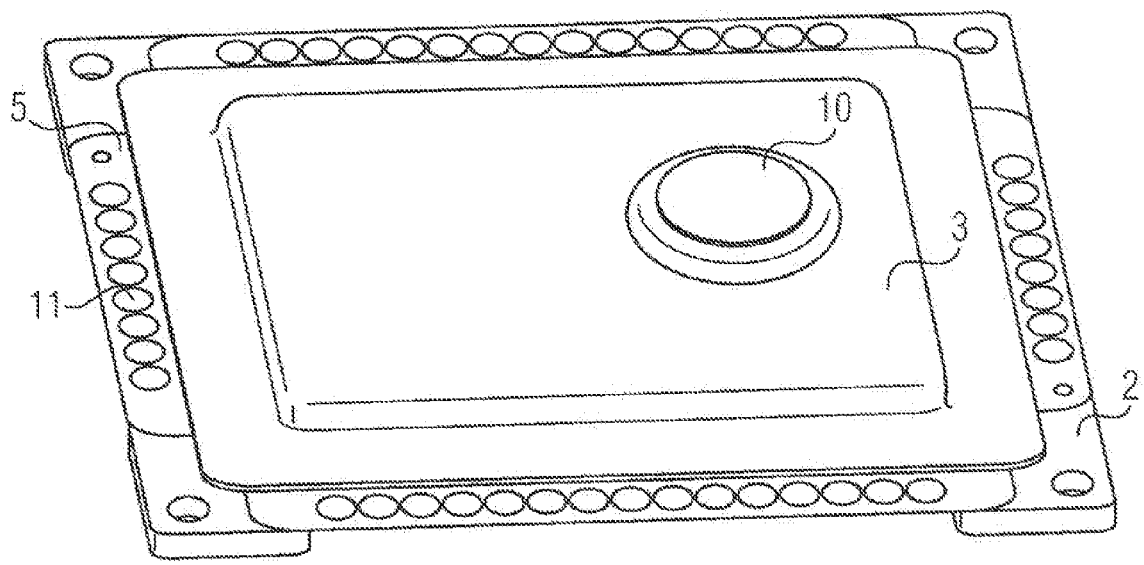

FIG. 2 shows the electronic housing 1 from FIG. 1 with a closed housing cover 3 and an attached label 10. The base plate 2 supports a printed circuit board 5, with the housing cover 3 being arranged in a circumferentially fixed manner directly on the printed circuit board 5. The printed circuit board 5 has a larger surface than the housing cover 3 and protrudes below the resting surface of the cover 3. The contacting points 11 for the connection to peripheral components are arranged outside the housing cover 3 in the edge region of the printed circuit board 5. The connection of the peripheral components to the printed circuit board can be produced for instance by means of soldering, welding or conductive bonding. With the label 10 attached to the filling port 4 in the housing cover 3, the electronic housing 1 can be sealed in a hermetic fashion over a long period of time. The electronic components can be advantageously sealed from aggressive environmental conditions such as mechanical or chemical stresses as a result of this simple sealing of the filling port 4.

To summarize, an electronic housing can be provided in accordance with the invention, which has a housing cover with a filling port for a casting compound, which can be easily reliably sealed without the danger of deforming the housing cover. The inventive seal of the filling port with a label can take place in an advantageously automated fashion here and can also be used in aggressive environmental conditions, for instance in motor vehicle gearboxes.

In accordance with the invention, electronic housings can also be advantageously used in a temperature range of −40° C. to +180° C.

The invention claimed is:

1. An electronic housing having at least two housing parts, the electronic housing comprising:
    a housing interior;
    electronic substrates disposed in said housing interior;
    at least one housing base;
    at least one electronic connection in the form of a printed circuit board fixed on said at least one housing base between said electronic substrates and components positioned outside the housing;
    a housing cover having a filling port for a casting compound; and
    a label closing said filling port.

2. The electronic housing according to claim 1, wherein said housing cover is made of metallic material.

3. The electronic housing according to claim 2, wherein said metallic material is aluminum, steel sheet or copper.

4. The electronic housing according to claim 1, wherein said label is an adhesive joint made of a carrier layer and an adhesive layer.

5. The electronic housing according to claim 4, wherein said carrier layer is made of a polymer or metallic material or of a composite material.

6. The electronic housing according to claim 1, wherein said label has a thickness of 25 μm to 350 μm.

7. The electronic housing according to claim 1, wherein said label has a thickness of 35 μm to 250 μm.

8. The electronic housing according to claim 1, wherein said label has a thickness of 50 μm to 150 μm.

9. The electronic housing according to claim 1, wherein said label has an adhesion surface on said housing cover, said filling port defines a surface, and a surface ratio of said adhesion surface of said label on said housing cover relative to said surface of said filling port is from 3:1 to 15:1.

10. The electronic housing according to claim 9, wherein said surface ratio is from 5:1 to 10:1.

11. The electronic housing according to claim 1, wherein said label is marked or printed.

12. A method for manufacturing an electronic housing according to claim 1, the method comprising:
    attaching the at least one printed circuit board to the at least one housing base as the at least one electronic connection;
    connecting the at least one printed circuit board to the electronic substrates disposed inside the housing and to the components positioned outside the housing;
    fastening the housing cover to a sealing zone;
    filling the casting compound through the filling port in the housing cover; and
    then closing the filling port with a label.

13. The method according to claim 12, which further comprises selecting the casting compound from the group consisting of resin, polyurethane compounds and one or more silicones or silicone gels.

14. The method according to claim 12, which further comprises evacuating the electronic housing after the step of filling the casting compound through the filling port and before the step of closing the filling port with the label.

15. The method according to claim 12, which further comprises providing the at least one printed circuit board as at least one flexible printed circuit board, and carrying out the attaching step by laminating the at least one flexible printed circuit board onto the at least one housing base as the at least one electronic connection.

16. An electronic control device, comprising:
    an electronic housing according to claim 1.

17. A transmission control of a motor vehicle, the transmission control comprising:
    an electronic housing according to claim 1.

18. A method for manufacturing an electronic housing having at least two housing parts, the method comprising:
    attaching at least one printed circuit board to a housing base as an electronic connection;
    connecting the at least one printed circuit board to an electronic substrate disposed inside the housing and to components positioned outside the housing;
    fastening a housing cover to a sealing zone;
    filling a casting compound through a filling port in the housing cover; and
    then closing the filling port with a label.

* * * * *